US008327223B2

(12) United States Patent
Otterstedt

(10) Patent No.: US 8,327,223 B2
(45) Date of Patent: Dec. 4, 2012

(54) SYSTEM AND METHOD FOR CONSTRUCTING MULTI-WRITE ERROR CORRECTING CODE

(75) Inventor: Jan Otterstedt, Unterhaching (DE)

(73) Assignee: Infineon Technologies AG, Neubiberg (DE)

( * ) Notice: Subject to any disclaimer, the term of this patent is extended or adjusted under 35 U.S.C. 154(b) by 923 days.

(21) Appl. No.: 12/366,388

(22) Filed: Feb. 5, 2009

(65) Prior Publication Data

US 2010/0199148 A1 Aug. 5, 2010

(51) Int. Cl.
*G06F 11/00* (2006.01)
(52) U.S. Cl. ...................................................... 714/763
(58) Field of Classification Search .................. 714/758, 714/763
See application file for complete search history.

(56) References Cited

U.S. PATENT DOCUMENTS

| | | | | |
|---|---|---|---|---|
| 5,841,795 A * | 11/1998 | Olarig et al. | | 714/768 |
| 6,009,548 A * | 12/1999 | Chen et al. | | 714/762 |
| 6,219,817 B1 * | 4/2001 | Holman | | 714/785 |
| 6,519,734 B1 * | 2/2003 | Bodnar et al. | | 714/761 |
| 6,941,505 B2 * | 9/2005 | Yada et al. | | 714/763 |
| 7,028,248 B2 * | 4/2006 | Chen et al. | | 714/785 |
| 7,039,854 B1 * | 5/2006 | Ireland et al. | | 714/785 |
| 7,500,173 B2 * | 3/2009 | Paul et al. | | 714/807 |
| 7,721,177 B2 * | 5/2010 | Gammel et al. | | 714/752 |
| 7,962,837 B2 * | 6/2011 | Jones, Jr. | | 714/781 |
| 8,001,450 B2 * | 8/2011 | Onishi et al. | | 714/785 |
| 2006/0282756 A1 | 12/2006 | Gammel et al. | | |

FOREIGN PATENT DOCUMENTS

DE 102005022107 A1 11/2006

OTHER PUBLICATIONS

Stefano, G. et al., "On-Chip Error Correcting Techniques for New-Generation Flash Memories", Proceedings of the IEEE, Apr. 2003, pp. 602-616, vol. 91, No. 4.

* cited by examiner

*Primary Examiner* — Scott Baderman
*Assistant Examiner* — Elmira Mehrmanesh
(74) *Attorney, Agent, or Firm* — Slater & Matsil, L.L.P.

(57) ABSTRACT

An embodiment of the invention relates to a memory device and a related method. In an embodiment, a check matrix for an error-correcting code is formed so that sets of input data bits can be written, wherein each set of input data bits generates one set of error-correcting code bits that can be written independently of each other and in an arbitrary order. An error-correcting code is thereby produced without the need to erase or copy any existing, originally written bit upon presentation of new input data.

24 Claims, 2 Drawing Sheets

SYSTEM AND METHOD FOR CONSTRUCTING MULTI-WRITE ERROR CORRECTING CODE

TECHNICAL FIELD

An embodiment of the invention relates generally to nonvolatile memories and methods, and more particularly to writing of data in a nonvolatile memory protected by an error-correcting code.

BACKGROUND

Embedded or stand-alone NVMs (nonvolatile memories) are memory devices used in digital systems that are capable of storing digital data that is not lost after removal of memory power. Examples of NVMs include, without limitation, flash memory devices and magnetic memory devices such as hard drives and floppy disks.

Often a requirement arises, e.g., in automotive and chip-card applications, that particular protected data in an NVM may never be erased once written, but may only be extended or its value increased. An example of an automotive application is an engine controller, which may also be employed to control other automotive functions such as a windshield wiper or a window actuator. A chipcard such as a credit card formed with a microprocessor may contain protected data such as personal data of the credit card holder. An example of an extended or increased data value is a data word specifying an address range of protected data in an NVM that may only be increased. For example, an NVM may contain an original 128 bytes of protected, unalterable data that is identified for protection with a data word for an address range with value "128." At a later time, an additional 256 bytes of protected, unalterable data may be stored in the NVM, the address range of which also needs to be identified. The additional 256 bytes of protected data may add an optional function to a suite of functions that may be provided with an automobile. Thus, the new protected address range for the data is 128+256=384 bytes. Accordingly, the address range for the data is increased from 128 to 384, and the byte identifying the new address range needs to be carefully protected. Logic, for example in hardware or firmware, may employ the protected address range to prevent erasing or altering data stored within that range.

Modification of protected data, such as the address range of the data in the example above, is not a problem, in principle, if the content of the NVM is not protected by an ECC (error-correcting code). An ECC protects the integrity of the stored data, allowing identification and correction of a certain number of erroneous bits when the data are read. In addition to the data bits themselves, ECC bits are stored with the data bits. A modern NVM invariably implements an ECC to meet reliability requirements.

Without an ECC, additional bits can be readily added (i.e., written) to previously stored data without altering the already written bits. But with an ECC, the ECC bits for the originally written data should be changed when additional data bits are written. In the general case, some of the original ECC bits would be erased, which is not ordinarily performed in typical NVMs, because in typical NVMs such as flash drives, whole blocks of data are erased, completely removing the information previously stored. This is contrary to the requirement that the specially identified, protected data in an NVM are not erased once written. One option, although inefficient, is to continue writing new blocks of data in a new portion of memory when such an erasable data is updated.

Thus, there is an unresolved need to provide a process and method to extend uneraseable data protected by an error-correcting code in a nonvolatile memory that avoids the disadvantages of conventional approaches.

SUMMARY OF THE INVENTION

In accordance with an exemplary embodiment, a check matrix for an error-correcting code and a related method are provided. The check matrix is formed so that sets of input data bits can be written, wherein each set of input data bits generates one set of ECC bits that can be written independently of each other and in an arbitrary order. An ECC is thereby produced without the need to erase or copy any existing, originally written bit upon presentation of new input data.

In an embodiment, a nonvolatile memory device is configured to protect its content with an error-correcting code. The nonvolatile memory device includes digital logic configured to implement a check matrix for the error-correcting code, and further includes digital logic to implement a multiplication of the check matrix with an input data word to produce a check vector for the input data word. The check matrix is partitioned into columns of equal bit width, and possibly one or more remaining columns. An EXCLUSIVE-OR operation performed on all rows of one of the columns of equal width of the check matrix produces a logical "0," excepting the EXCLUSIVE-OR operation performed on a particular row of the one of the columns of equal width of the check matrix produces a logical "1." The particular row of the one of the columns of equal width of the check matrix producing the logical "1" by the EXCLUSIVE-OR operation is different from the particular row of any other column of equal width of the check matrix. In an embodiment, the EXCLUSIVE-OR operation performed on the particular row of consecutive columns of equal width of the check matrix produces a logical "1" in correspondingly consecutive rows.

The nonvolatile memory device can be employed to store control data for an automotive application, such as an engine controller application, or for a chipcard application.

BRIEF DESCRIPTION OF THE DRAWINGS

The details of one or more embodiments of the invention are set forth in the accompanying drawings and the description below. Other features, objects, and advantages of the invention will be apparent from the description and drawings, and from the claims. For a more complete understanding of the invention, reference is now made to the following descriptions taken in conjunction with the accompanying drawings, in which:

DETAILED DESCRIPTION OF ILLUSTRATIVE EMBODIMENTS

Figure 1:
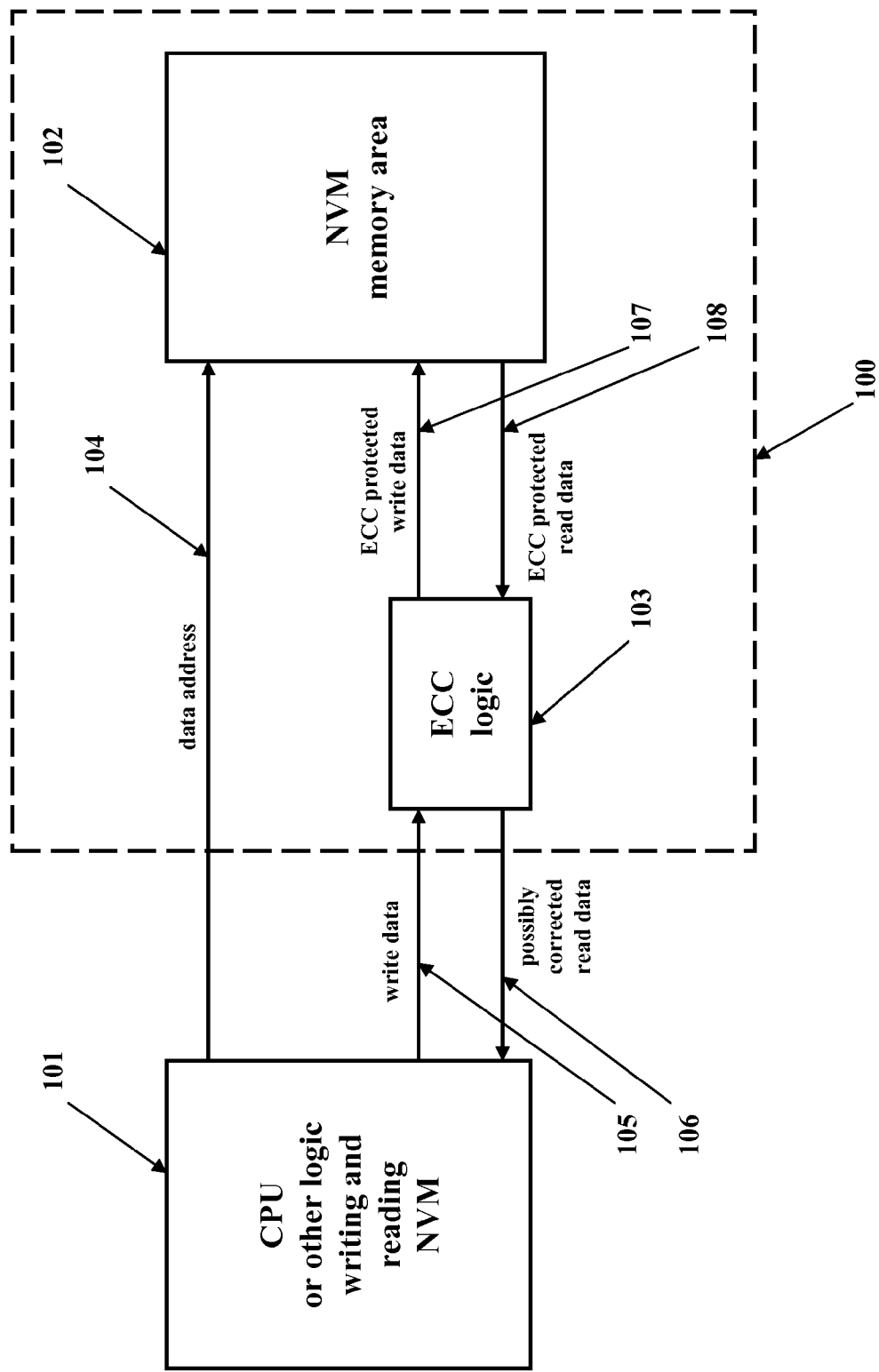
FIG. 1 illustrates a nonvolatile memory including a check matrix for an error-correcting code, constructed according to an embodiment.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to exemplary embodiments in a specific context, namely an NVM device configured to store and extend protected data.

An embodiment of the invention may be applied to various NVM arrangements, for example, to an automotive application wherein protected data, such as an address range for program data, may be extended to update or add additional vehicle features. Other NVM arrangements can be constructed and applied using processes as introduced herein in different contexts using inventive concepts described herein, for example, an NVM configured to store credit card information in a chipcard, or to control programming for the NVM itself.

A solution to the problem of updating existing uneraseable data protected by an error-correcting code in a nonvolatile memory when the data is to be extended or its value increased is to copy the existing data to a different location in the NVM. Here extra logic, including hardware or software depending on the application, and considerations such as the security level, are required to ensure that the data is only modified in an allowable way. Extra NVM storage space is required, and the operations of writing and reading take longer than corresponding operations for normal, erasable data. In addition, the memory system must keep track of the sequence of locations in which the data is stored. The system must also protect the data against manipulation and against power loss during all these operations. Such an approach to update existing uneraseable data is inefficient and wasteful of hardware and time resources.

As described herein, a specially designed ECC and a particular process to encode data to be stored are employed to enable efficient updating of existing uneraseable data protected by an error-correcting code in a nonvolatile memory.

The specially designed ECC can also be employed to protect normal, erasable data. Additionally, the specially designed ECC enables writing sets of input data bits, wherein each set of input data bits generates one set of ECC bits. These sets of bits can be written independently of each other and in an arbitrary order. A valid ECC is produced upon presentation of new input data without the need to erase or copy any existing, originally written bit.

The specially designed ECCs are now described using an exemplary 6-bit ECC configured to protect 16 bits of an input data word. The exemplary ECC can detect and correct single-bit errors in a 16-bit input data word, and can detect double-bit errors.

Without loss of generality, a "1" is employed in the following description of data words and code check words ("vectors") to represent a bit that has already been written and may not be changed again, and a "0" is employed to represent a bit that has been erased but may be changed again in a further step.

For a 16-bit input data word/vector "a", a 6-bit check vector "c" is computed by multiplying the vector a by the transpose of a check matrix [A] that defines the ECC (employing modulo-2 arithmetic):

$$c = a[A]^T$$

-continued $$A = \begin{bmatrix} 0 & 1 & 1 & 0 & 0 & 0 & 0 & 1 & 1 & 1 & 1 & 0 & 0 & 1 & 1 & 1 \\ 1 & 1 & 0 & 0 & 0 & 0 & 1 & 1 & 0 & 1 & 0 & 1 & 1 & 0 & 0 & 0 \\ 1 & 1 & 0 & 1 & 0 & 1 & 0 & 0 & 0 & 0 & 0 & 1 & 0 & 1 & 1 & 1 \\ 1 & 0 & 1 & 0 & 1 & 1 & 1 & 0 & 0 & 1 & 1 & 0 & 1 & 0 & 1 & 0 \\ 0 & 0 & 0 & 1 & 1 & 1 & 1 & 0 & 1 & 0 & 1 & 1 & 0 & 0 & 0 & 1 \\ 0 & 0 & 1 & 1 & 1 & 0 & 0 & 1 & 1 & 0 & 0 & 0 & 1 & 1 & 0 & 0 \end{bmatrix}$$

In the equation above for the check matrix [A], the "1"s and "0"s are real binary bits, not representations of changed or unchanged bits as previously described, i.e., the "1"s and "0"s in the matrix [A] are ordinary binary "1"s and "0"s.

The check matrix [A] is formed to produce an error-correcting code for the input data word a. The check matrix [A] produces the error-correcting code check vector c by multiplication of the check matrix [A] with an input data word a. The check matrix [A] is formed of columns of equal width and a remaining column that includes the remaining bits. In the example above, the check matrix [A] is formed with five columns that are each three bits wide, and a remaining column that is one bit wide. The check matrix [A] is constructed so that an EXCLUSIVE-OR operation performed on all rows of one of the columns of equal width produces a logical "0," excepting the EXCLUSIVE-OR operation performed on a particular row of the one of the columns of equal width that produces a logical "1." For example, the rows of one of the columns of equal width contain no or two "1"s, except one particular row that contains one or three 1"s. The particular row of the one of the columns of equal width of the check matrix [A] producing the logical "1" by the EXCLUSIVE-OR operation is different from the particular row of any other column of equal width of the check matrix [A].

Construction of a check matrix [A] for an ECC is a process well known in the art, and may employ, without limitation, an error-correcting code from the Bose-Chaudhuri-Hocquenghem code family, such as a Hamming or a Reed-Solomon error-correcting code. The memory data protection arrangement described herein is not limited to these codes, but can be implemented for any ECC structure.

Effectively, the multiplication illustrated above selects all columns of the matrix [A] where the corresponding bit of the input data word a is 1, and then computes the EXCLUSIVE-OR of all these columns. The resulting code word is the vector c representing the ECC bits.

For example, the 16-bit input data word a=[111 000 000 000 000 0]

produces the six ECC code word bits c=[100 000].

This particular input data word for the vector a indicates that the first three bits of the vector a are to be written/changed, and the following 13 bits are unchanged. For the ECC code word, the resulting vector c with a "1" in the first bit position indicates that only a unique bit of the code word c is changed as a consequence of the particular input data word a. This occurs for the particular choice that has been described for the matrix [A]. If a different group of three bits of the input data word a is changed, a different unique bit of the code word c is correspondingly changed. Accordingly, if a different group of three bits of the input data word a is changed, the bits of the code word c associated with other groups of the input data word a are not changed.

The check matrix [A] above (in addition to its normal requirements for an ECC) is constructed in such a way that the EXCLUSIVE-OR operation for each of the blocks of three columns indicated above by the dashed vertical lines contains exactly one 1 (i.e., a written bit), in a distinct position, i.e., each block contains an odd number of "1"s.

Five input data words for the input data word a are now illustrated that produce a unique bit change for the code word c, relying on the properties as described above for the check matrix [A]: The input data words a0, . . . , a4 are employed, for example, to describe an address data range for protected data. The input data word a0, for example, may represent 128 bytes. The input data word a1 may represent an additional 256 bytes. A sequence of up to five changes to the address data range for protected data can be accommodated in an arbitrary order by this process, i.e., as represented by the input data words a0, . . . , a4. Once written, an input data word such as a0 is not erased, which would cause loss of protection for the associated block of protected data in the NVM.

Block 0: Data word a0=[11100000 00000000] results in the ECC bits c0=[100 000].

Block 1: Data word a1=[00011100 00000000] results in the ECC bits c1=[010 000].

Block 2: Data word a2=[00000011 10000000] results in the ECC bits c2=[001 000].

Block 3: Data word a3=[00000000 01110000] results in the ECC bits c3=[000 100].

Block 4: Data word a4=[00000000 00001110] results in the ECC bits c4=[000 010].

Since the operation of the ECC is linear, the addition of two of the above data words a0, . . . , a4 results in the respective addition of the check word c0, . . . , c4, thereby producing changes in two bits of the check word c. During such an addition or the subsequent addition of any other data word out of a0, . . . , a4, only additional "1"s are generated. A "1" does not need to be switched back to a "0," i.e., the protected bits advantageously do not need to be erased.

Several examples of such addition of data words follow:

$a0+a3$=[1110000001110000] results in $c0+c3$=[100100]

$a0+a3+a4$=[1110000001111110] results in $c0+c3+c4$=[100110]

$a0+a2+a3+a4$=[1110011111111110] results in $c0+c2+c3+c4$=[101110]

$a0+a1+a2+a3+a4$=[1111111111111110] results in $c0+c1+c2+c3+c4$=[111110]

Resulting from this property, starting from a fully erased word, $2^5$=32 combinations of different values of an input data word can be encoded in this example by adding a set of the five data vectors from a0, . . . , a4, where, for example, selecting an input data word an may denote adding $2^n$ to the stored value of the address range of the protected data. Once a value is written in this manner, the number of "1"s and thus the value of the check vector c can only be increased, and it can be increased without the need to erase a bit therein. A valid set of ECC bits is always produced.

The correction of single-bit errors and detection of double-bit errors is performed as usual, without the need for special hardware or software measures.

Hardware resources that are ordinarily implemented in an NVM are used, without the need for additional hardware or software overhead. Nevertheless, a unique feature for the construction of the check matrix is incorporated in the chip and in the application. Particular data stored using the proposed method is safe and protected by an ECC because erasing of such data is prevented. Nevertheless, the data can be changed in a defined way, preserving ECC protection.

Several variations of the memory data protection arrangement described above can be readily constructed. Any ECC scheme with an increased or decreased number of protected data bits and ECC bits from the example described hereinabove can be used wherein each distinct set of combined columns (not necessarily restricted to three columns as illustrated in the example above) is selected in such a way that exactly one distinct bit (or set of bits) is generated in the ECC check vector c when an EXCLUSIVE-OR operation is performed on the rows of the columns. The columns combined in a set need not be consecutive as long as the corresponding input data words a are employed that have the "1"s in the respective bits. For the example above, all columns of the matrix [A] may be interchanged as long as the respective bits in the data words a0, . . . , an are also interchanged.

Turning now to FIG. 1, illustrated is a nonvolatile memory device 100 including an error-correcting code, constructed according to an embodiment. The nonvolatile memory device 100 includes a check matrix for the error-correcting code, such as a Hamming or a Reed-Solomon error-correcting code. The error-correcting code is constructed, as described herein, so that sets of input data bits can be written wherein each set of input data bits generates one set of ECC bits that can be written independently of each other. The nonvolatile memory device 100 includes an NVM memory area 102 and ECC logic 103. A data source or sink, 101 such as a CPU or other logical device writing and reading data to and from the nonvolatile memory device provides a data address 104 for the data to be stored or read. Write data 105 is coupled to ECC logic 103 that adds a check vector to the write data, i.e., an input data word, to produce ECC-protected write data 107 that is stored in the NVM memory area. The ECC logic 103 produces the check vector by multiplication of the check matrix with the input data word. When a read operation is executed by the data source or sink 101, ECC-protected read data is obtained from the NVM memory area, and ECC logic 103 examines the read data for errors that are detected and corrected by the ECC logic 103 employing error-correcting logic. The possibly corrected read data 106 is then coupled to the data source or sink 101.

Figure 2:
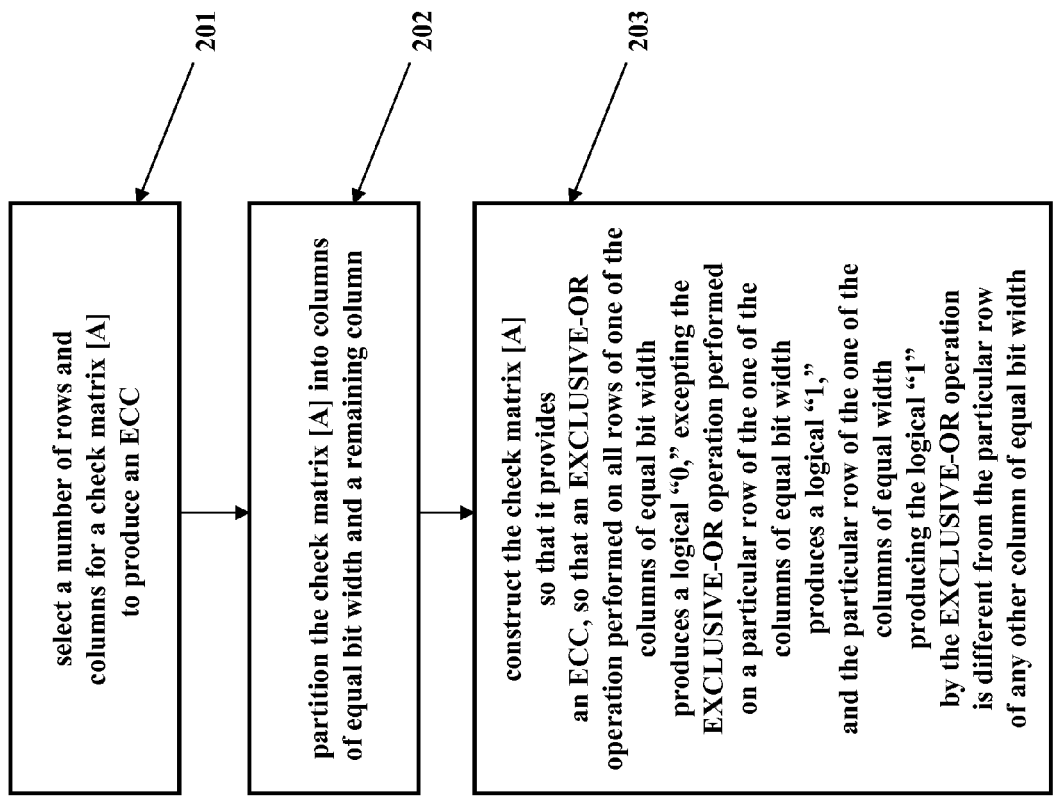
FIG. 2 illustrates a flowchart of a process to construct a check matrix for an error-correcting code, constructed according to an embodiment.

Turning now to FIG. 2, illustrated is a flowchart illustrating a process to form a check matrix, constructed according to an embodiment. Beginning at block 201, the number of rows and columns for the check matrix is selected to produce an ECC. In block 202, the check matrix is partitioned into columns of equal bit width and a remaining column. In block 203, the check matrix is further constructed so that an EXCLUSIVE-OR operation performed on all but one row of one of the columns of equal bit width produces a logical "0." However, the check matrix is constructed so that the EXCLUSIVE-OR operation performed on a particular row of one of the columns of equal bit width produces a logical "1." The check matrix is further constructed so that the particular row of the one of the columns of equal bit width producing the logical "1" by the EXCLUSIVE-OR operation is different from the particular row of any other column of equal bit width.

The concept has thus been introduced of constructing a check matrix for an error-correcting code so that sets of input data bits can be written wherein each set of input data bits generates one set of ECC bits that can be written independently of each other and in an arbitrary order. An ECC is thereby produced without the need to erase or copy any existing, originally written bit upon presentation of new input data.

In an embodiment, a nonvolatile memory device is configured to protect its content with an error-correcting code. The nonvolatile memory device includes digital logic configured to implement a check matrix for the error-correcting code, and further includes digital logic to implement a multiplication of the check matrix with an input data word to produce a check vector for the input data word. The check matrix is partitioned into columns of equal bit width, and possibly one or more remaining columns. An EXCLUSIVE-OR operation performed on all rows of one of the columns of equal width of the check matrix produces a logical "0," excepting the EXCLUSIVE-OR operation performed on a particular row of the one of the columns of equal width of the check matrix produces a logical "1." The particular row of the one of the columns of equal width of the check matrix producing the logical "1" by the EXCLUSIVE-OR operation is different from the particular row of any other column of equal width of the check matrix. In an embodiment, the EXCLUSIVE-OR operation performed on the particular row of consecutive columns of equal width of the check matrix produces a logical "1" in correspondingly consecutive rows. In an embodiment, the check matrix is a 6-by-16 matrix providing a six-bit check word for 16-bit input data word. In an embodiment, the check matrix is formed of five columns, each of the five columns three bits wide, and the remaining column one bit wide. In an embodiment, the nonvolatile memory device comprises control data for an automotive application. In an embodiment, the automotive application comprises an engine controller application. In an embodiment, the nonvolatile memory device comprises control data for a chipcard application. In an embodiment, the bit width of the possibly one or more remaining columns is narrower than the bit width of the columns of equal bit width. In an embodiment, the digital logic is configured to protect data described by the input data word. In an embodiment, the multiplying the check matrix by the input data word to produce the check vector is performed employing modulo-2 arithmetic.

Another exemplary embodiment provides a method of protecting the content of a nonvolatile memory device with an error-correcting code. In an embodiment, the method includes forming a check matrix in the nonvolatile memory device for the error-correcting code. The check matrix is formed of columns of equal bit width and possibly one or more remaining columns, and an EXCLUSIVE-OR operation performed on all rows of one of the columns of equal width of the check matrix produces a logical "0," excepting the EXCLUSIVE-OR operation performed on a particular row of the one of the columns of equal width of the check matrix produces a logical "1." The particular row of the one of the columns of equal width of the check matrix producing the logical "1" by the EXCLUSIVE-OR operation is different from the particular row of any other column of equal width of the check matrix. The method further includes multiplying the check matrix with an input data word to produce a check vector for the input data word. In an embodiment, the EXCLUSIVE-OR operation performed on the particular row of consecutive columns of equal width of the check matrix produces a logical "1" in correspondingly consecutive rows. In an embodiment, the method includes forming the check matrix as a 6-by-16 matrix providing a six-bit check word for 16-bit input data word. In a further embodiment, the method includes partitioning the check matrix into five columns, each of the five columns three bits wide, and the remaining column one bit wide. In an embodiment, the nonvolatile memory device comprises control data for an automotive application. In an embodiment, the automotive application comprises an engine controller application. In an embodiment, the nonvolatile memory device comprises control data for a chipcard application. In an embodiment, the method includes forming the bit width of the possibly one or more remaining columns narrower than the bit width of the columns of equal bit width. In an embodiment, the method includes forming the digital logic to protect data described by the input data word. In an embodiment, the method includes multiplying the check matrix by the input data word employing modulo-2 arithmetic to produce the check vector.

Although processes to store and extend protected data in an NVM and related methods have been described for application to automotive environments, it should be understood that other applications of these processes such as for chipcards employing a microprocessor are contemplated within the broad scope of the invention, and need not be limited to automotive applications employing processes introduced herein.

Although the invention has been shown and described primarily in connection with specific exemplary embodiments, it should be understood by those skilled in the art that diverse changes in the configuration and the details thereof can be made without departing from the essence and scope of the invention as defined by the claims below. The scope of the invention is therefore determined by the appended claims, and the intention is for all alterations that lie within the range of the meaning and the range of equivalence of the claims to be encompassed by the claims.

What is claimed is:

1. A nonvolatile memory device configured to protect its content with an error-correcting code, comprising:
   a digital logic configured to implement a check matrix for the error-correcting code, and further configured to implement a multiplication of the check matrix with an input data word to produce a check vector for the input data word,
   wherein the check matrix comprises columns of equal bit width,
   wherein an EXCLUSIVE-OR operation performed on all rows of one of the columns of equal width of the check matrix produces a logical "0," excepting the EXCLUSIVE-OR operation performed on a particular row of the one of the columns of equal width of the check matrix produces a logical "1," and
   wherein the particular row of the one of the columns of equal width of the check matrix producing the logical "1" by the EXCLUSIVE-OR operation is different from a particular row of any other column of equal width of the check matrix.

2. The nonvolatile memory device as claimed in claim 1, wherein the EXCLUSIVE-OR operation performed on the particular row of consecutive columns of equal width of the check matrix produces a logical "1" in correspondingly consecutive rows.

3. The nonvolatile memory device as claimed in claim 1, wherein the check matrix is a 6-by-16 matrix, wherein the input data word is a 16-bit input data word, and wherein the check vector is a six-bit check word.

4. The nonvolatile memory device as claimed in claim 3, wherein the check matrix is formed of five columns, wherein each of the five columns is three bits wide, and a remaining column is one bit wide.

5. The nonvolatile memory device as claimed in claim 1, wherein the nonvolatile memory device comprises control data for an automotive application.

6. The nonvolatile memory device as claimed in claim 5, wherein the automotive application comprises an engine controller application.

7. The nonvolatile memory device as claimed in claim 1, wherein the nonvolatile memory device comprises control data for a chipcard application.

8. The nonvolatile memory device as claimed in claim 1, wherein the digital logic is further configured to protect data described by the input data word.

9. The nonvolatile memory device as claimed in claim 1, wherein the multiplying the check matrix by the input data word to produce the check vector is performed employing modulo-2 arithmetic.

10. The device as claimed in claim 1, wherein the check matrix comprises one or more remaining columns.

11. The nonvolatile memory device as claimed in claim 10, wherein a bit width of the one or more remaining columns is narrower than the bit width of the columns of equal bit width.

12. The device as claimed in claim 1, wherein the check matrix comprises only columns of equal bit width.

13. A method of protecting a content of a nonvolatile memory device with an error-correcting code, the method comprising:
   forming a check matrix in the nonvolatile memory device for the error-correcting code, wherein the check matrix comprises columns of equal bit width;
   performing an EXCLUSIVE-OR operation on all rows of one of the columns of equal width of the check matrix produces a logical "0," excepting the EXCLUSIVE-OR operation performed on a particular row of the one of the columns of equal width of the check matrix produces a logical "1," wherein the particular row of the one of the columns of equal width of the check matrix producing the logical "1" by the EXCLUSIVE-OR operation is different from a particular row of any other column of equal width of the check matrix; and
   multiplying the check matrix with an input data word to produce a check vector for the input data word.

14. The method as claimed in claim 13, further comprising forming the check matrix so that the EXCLUSIVE-OR operation performed on the particular row of consecutive columns of equal width of the check matrix produces a logical "1" in correspondingly consecutive rows.

15. The method as claimed in claim 13, wherein the check matrix is a 6-by-16 matrix, wherein the input data word is a 16-bit input data word, and wherein the check vector is a six-bit check word.

16. The method as claimed in claim 15, wherein the check matrix comprises five columns, wherein each of the five columns is three bits wide, and a remaining column is one bit wide.

17. The method as claimed in claim 13, wherein the nonvolatile memory device stores control data for an automotive application.

18. The method as claimed in claim 17, wherein the automotive application comprises an engine controller application.

19. The method as claimed in claim 13, wherein the nonvolatile memory device stores control data for a chipcard application.

20. The method as claimed in claim 13, wherein a digital logic is further configured to protect data described by the input data word.

21. The method as claimed in claim 13, further comprising employing modulo-2 arithmetic to multiply the check matrix by the input data word to produce the check vector.

22. The method as claimed in claim 13, wherein the check matrix comprises one or more remaining columns.

23. The method as claimed in claim 22, wherein a bit width of the one or more remaining columns is narrower than the bit width of the columns of equal bit width.

24. The method as claimed in claim 13, wherein the check matrix comprises only columns of equal bit width.

* * * * *